United States Patent [19]

Lienhard

[11] Patent Number: 4,559,495
[45] Date of Patent: Dec. 17, 1985

[54] TRANSDUCER FREE OF ANY MAGNETIC CORE FOR CONTACTLESS CURRENT MEASUREMENT

[75] Inventor: Heinz Lienhard, Zug, Switzerland
[73] Assignee: LGZ Landis & Gyr Zug AG, Zug, Switzerland
[21] Appl. No.: 360,363
[22] Filed: Mar. 22, 1982
[30] Foreign Application Priority Data
Mar. 26, 1981 [CH] Switzerland ............... 2038/81
[51] Int. Cl.$^4$ ............... G01R 33/00; G01R 1/20
[52] U.S. Cl. ............... 324/117 R; 324/127
[58] Field of Search ............... 324/127, 117 R, 117 H, 324/249, 255

[56] References Cited
U.S. PATENT DOCUMENTS
3,323,056  5/1967  Haley ............... 324/127

FOREIGN PATENT DOCUMENTS
2333514  1/1975  Fed. Rep. of Germany.
3008308 12/1980  Fed. Rep. of Germany.
2000873  1/1979  United Kingdom.

OTHER PUBLICATIONS
Kirschner, U.; "Der Hall-Effekt in der Elektrischen Messtechnik"; Elektrotechnik; vol. 50; Oct. 2, 1968; pp. 304–308.

*Primary Examiner*—Ernest F. Karlsen
*Attorney, Agent, or Firm*—Kenneth Rubenstein

[57] ABSTRACT

A transducer free of any magnetic core for contactless measurement of a current includes an electrically conducting strip adapted to carry the current in a predetermined direction. The current thus generates a first primary magnetic field which has a direction at right angles to the predetermined direction near one side of the strip, and a second primary magnetic field near the other side of the strip, which has a direction opposite to the predetermined direction. A first magnetic field sensor near one side measures the first primary magnetic field and provides a first output signal, and a second magnetic field sensor near the other side of the strip measures the second primary magnetic field, and provides a second output signal. A circuit connected to the first and second magnetic field sensor processes the first and second output signals, and generates an output signal proportional to the measured current. This construction minimizes the influence of any stray magnetic field on the measurement of the current.

6 Claims, 11 Drawing Figures

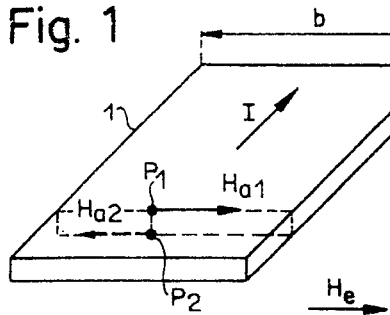
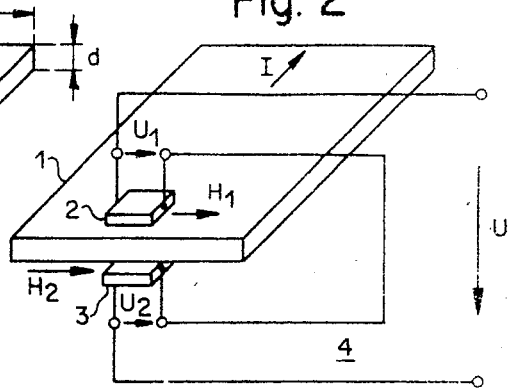
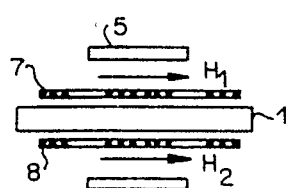
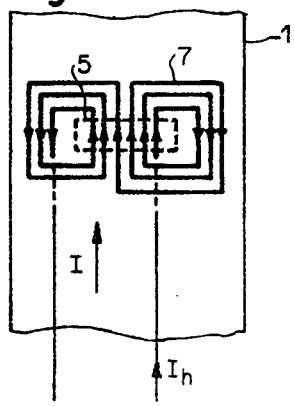
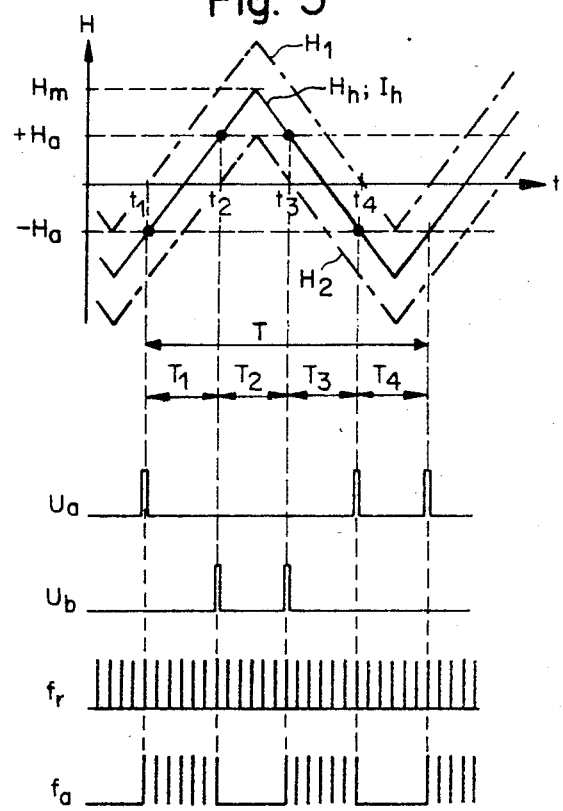
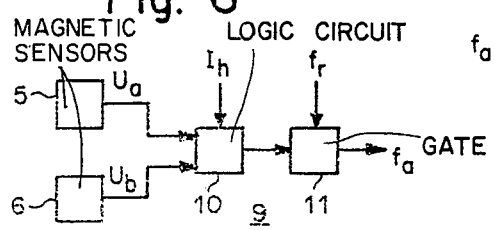

TRANSDUCER FREE OF ANY MAGNETIC CORE FOR CONTACTLESS CURRENT MEASUREMENT

BACKGROUND OF THE INVENTION

A measurement transducer of this type is known from British Pat. No. 2,000,873, corresponding to U.S. application Ser. No. 918,446, filed on June 23, 1978, since matured into U.S. Pat. No. 4,309,655 in which the magnetic field sensor is alternately magnetized in both directions of saturation and supplies a pulse signal, where characteristic time intervals are a measure of the current to be measured. In Swiss Patent Application No. 7235/80-1 it has further been proposed to operate a measurement transducer of this type with the aid of a stochastic auxiliary magnetic field. In Swiss Patent Application No. 9568/80-5, corresponding to U.S. patent application Ser. No. 332,215, filed on Dec. 18, 1981, there has been proposed a measurement transducer of the aforedescribed type which operates as a compensated measurement transducer and generates a voltage proportional to the measurement current. The magnetic field sensor of measurement transducers of this type reacts not only on the magnetic field produced by the current to be measured, but is also influenced by any stray magnetic field. Such interfering, or stray fields generate in known measurement transducers of the aforedescribed kind measurement errors, which can only be eliminated if the measurement transducers are carefully shielded from any stray or other field.

From the journal "Elektrotechnik" No. 19, of Oct. 2, 1968, pp. 304 through 308, it is known to insert into each airgap of a magnetic core a hall generator.

From German Pat. OS No. 2333514 a method is known to determine a voltage or a current, in which a triangularly-shaped voltage is compared with the measurement signal.

From German Pat. OS No. 3008308 there is known a current divider having a U-shaped bent strip; this patent corresponds to U.S. application Ser. No. 160,326 of Jacob De Vries, and is assigned to the assignee of the present invention.

SUMMARY OF THE INVENTION

It is accordingly an object of the present invention to obviate the aforedescribed disadvantages, and to devise a measurement transducer which is substantially insensitive to stray fields by automatically compensating the effect of such stray fields.

This object is attained in a transducer free of any magnetic core for contactless measurement of a current, and wherein the transducer includes an electrically conducting strip adapted to carry the current in a predetermined direction, the current thereby generating a first primary magnetic field having a direction at right angles to the predetermined direction near one side of the strip, and a second primary magnetic field near the other side thereof in a direction opposite to the predetermined magnetic direction. A first magnetic field sensor near the one side measures the first primary magnetic field and provides a first output signal, circuit means connected to the first magnetic field sensor generate an output indication proportional to the current, and a second magnetic field sensor near the other side measures the second primary magnetic field, and provides a second output signal; the circuit means is additionally connected to the second magnetic field sensor for processing the first and second output signals. The influence of any stray magnetic field on the measurement of the current is thus minimized.

Further objects and advantages of the invention will be set forth in part in the following specification, and in part will be obvious therefrom, without being specifically referred to, the same being realized and attained as pointed out in the claims hereof.

BRIEF DESCRIPTION OF THE DRAWINGS

For a fuller understanding of the nature and objects of the invention, reference should be had to the following detailed description, taken in connection with the accompanying drawings in which:

FIG. 1 is a perspective view of a flat conducting strip;

FIG. 2 is a perspective view of a measurement transducer;

FIG. 3 is a schematic elevational view of a measurement transducer;

FIG. 4 is a plan view of the measurement transducer according to FIG. 3;

FIG. 5 is a diagram of various waveforms and pulse signals;

FIG. 6 is a simplified block schematic diagram of the circuit of the measurement transducer, according to the present invention;

DESCRIPTION OF THE PREFERRED EMBODIMENTS

Figure 7:
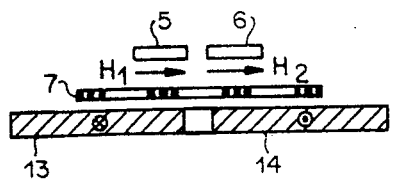
FIG. 7 is an elevational cross-section of the measurement transducer along line 7—7 of FIG. 8.

Referring now to the drawings, and in particular to FIG. 1, an electrical conducting flat strip 1 has a thickness d which is small in comparison to its width b. A current I to be measured flowing along the longitudinal direction of the strip 1 generates an external magnetic field, which is denoted at a point $p_1$ on the upper flat surface of this strip and near the center thereof with $H_{a1}$ and at a point $P_2$ opposite thereto with $H_{a2}$. Proceeding from point $P_1$ to point $P_2$, the external magnetic field changes from the value $H_{a1}$ to the value $H_{a2}$ where $$H_a = H_{a1} = -H_{a2} \approx (I/2d)$$

The nearer the point $P_1$ to the point $P_2$, namely the thinner the strip 1, the more difficult it becomes to generate such a field gradient externally. This fact is made use of in order to compensate any interfering influence of magnetic stray fields.

The measurement transducer according to FIG. 2 consists of a flat strip 1, two magnetic field sensors 2 and 3 and a measurement circuit 4. The magnetic field sensors 2 and 3 are disposed near the surface of the flat strip 1, so that the magnetic field sensor 2 measures the external magnetic field $H_{a1}$ at a point $P_1$, and so that the magnetic field sensor 3 measures the external magnetic field $H_{a2}$, which has a direction opposite to that of the external magnetic field $H_{a1}$, at a point $P_2$.

If an externally generated magnetic stray field $H_e$ acts on the measurement transducer in the direction of the external magnetic field $H_{a1}$, then the magnetic field sensor 2 measures the magnetic field $$H_1 = H_a + H_e$$

and the magnetic field sensor 3 measures the magnetic field $$H_2 = -H_a + H_e.$$

The magnetic field sensors 2 and 3 have each an at least approximately linear transfer characteristic and provide output signals $U_1$ or $U_2$, wherein $$U_1 = k \cdot H_1$$

$$U_2 = k \cdot H_2$$

The output signals $U_1$ and $U_2$ are superimposed in the measurement circuit 4 in such a manner that an output voltage U is generated, which is proportional to the difference of the output signals $U_1$ and $U_2$, and which automatically compensates the influence of any stray magnetic field $H_e$ in the measurement result. In the example illustrated the magnetic field sensors 2 and 3 are connected in series so that:

$$U = U_1 - U_2 = k(H_1 - H_2) = k[(H_a + H_e) - (-H_a + H_e)] = 2KH_a.$$

In FIG. 3, which is not shown to scale, there will be seen magnetic field sensors 5 and 6, which have a non-linear transfer characteristic, and which again measure the magnetic field $H_1$ or $H_2$ at the points $P_1$ or $P_2$, as seen in FIG. 1. Two flat coils 7 and 8, in which an alternating auxiliary current $I_h$, as seen in FIG. 4, passes, and which flat coils are disposed, in the example illustrated, between the flat strip 1 on one hand, and the magnetic field sensors 5 and 6 on the other hand, each generate a magnetic auxiliary field $H_h$; these fields, as can be seen from FIG. 5, are triangular in shape. The magnetic field $H_1$ acts on the magnetic field sensor 5 as shown below $$H_1 = H_h + H_a + H_e$$

and the magnetic field $H_2$ acts on the magnetic field sensor 6 as follows $$H_2 = H_h - H_a + H_e$$

The flat coils 7 and 8 may be wound coils, as shown in FIG. 4, or may be implemented by a double coil, according to established thin film techniques.

The operation of the measurement transducer described will now be explained with the aid of the schematic diagram of FIG. 5. The magnetic field sensor 5 supplies at the zero crossing of the magnetic field $H_1$ an impulse shown as the signal $U_a$, and the magnetic field sensor 6 supplies during zero crossing of the magnetic field $H_2$ an impulse in the form of the signal $U_b$. If no external magnetic field $H_e$ is present then the magnetic field sensor 5 is actuated at times $t_1$ and $t_4$, when $H_h = -H_a$, and the magnetic field sensor 6 is actuated at times $t_2$ and $t_3$, when $H_h = +H_a$. Thus $$T_1 = t_2 - t_1 = T_3 = t_4 - t_3 = H_a \cdot (T/2H_m)$$

where T is the time period, and $H_m$ the amplitude of the auxiliary magnetic field $H_h$. The time interval $T_1$ or $T_3$ between an impulse $U_a$ of the magnetic field sensor 5, and an impulse $U_b$ of the magnetic field sensor 6 is therefore proportional to the external magnetic field $H_a$, and therefore to the current I to be measured.

A stray field $H_e$ causes a displacement of the triangular waveform $H_h$ upwardly or downwardly. Consequently the times $t_1$ and $t_2$ are shifted, for example leftwardly, and the times $t_3$ and $t_4$ are shifted in the same measure rightwardly, without, however, influencing the time intervals $T_1$ or $T_3$. These time intervals are therefore invariant with respect to the external magnetic field $H_e$. The time intervals $T_2$ and $T_4$ are, however, the stray magnetic field $H_e$, vary in opposite respective directions, and can be made use of for supervising such external or stray magnetic fields.

A simplified schematic block diagram of a circuit for measuring a current, according to the present invention, is shown in FIG. 6. The circuit is connected to magnetic field sensors 5 and 6, and consists of a circuit logic 10 and a gate 11. During an increasing half period of the auxiliary current $I_h$ the logic circuit 10 opens the gate 11, by an impulse $U_a$ of the magnetic field sensor 10 the logic circuit 5 closes again the gate 11 by the next impulse $U_b$ of the magnetic field sensor 6. When the auxiliary current $I_h$ decreases, the gate 11 is opened by an impulse $U_b$ of the magnetic field sensor 6, and is closed by impulse $U_a$ of the magnetic field sensor 5. During the time intervals $T_1$ and $T_3$, in which the gate 11 is open, the impulses of a reference frequency $f_r$ are applied to the gate 11 and appear at the output thereof. The average value of the output frequency $f_a$ is proportional to the current I to be measured.

The common principle applicable to the measurement transducer, according to FIG. 2, and to that according to FIGS. 3 through 6 can now be easily recognized. In each case there are provided two magnetic field sensors, in which one is subjected to a first magnetic field, and the other to a second magnetic field having a direction opposite to that of the first magnetic field. The signals of the magnetic field sensors are now processed in the measurement circuit, so a stray field acting on one magnetic field sensor increases the output signal of the measurement circuit—in one case the voltage U, in the other case the time intervals $T_1$ and $T_3$, or the output frequency $f_a$—while the same stray magnetic field acting on the other magnetic field sensor reduces the output signal of the measurement circuit in the same measure. In general there are therefore obtained by means of the two magnetic field sensors 2 and 3, on one hand, or 5 and 6 on the other hand, measurement values $s^+$ and $s^-$ where $$s^+ \sim H_a + H_e$$

$$s^- \sim -H_a + H_e,$$

In the measurement circuits 4 or 9 there are formed output measurement values from these measurements $$s = (s^+ - s^-) \sim 2H_a$$

This principle may also be applied if the auxiliary current $I_h$ and therefore the auxiliary magnetic field $H_h$ does not follow a deterministic, but a stochastic function. Here the magnetic field sensors 5 and 6 supply stochastic signals $s^+$ and $s^-$, whose mathematical expectation E is a measure for the magnetic field $H_a$, and the stray magnetic field $H_e$ as shown hereunder:

$$e\{s^+\} \sim H_a + H_e$$

$$E\{s^-\} \sim -H_a + H_e.$$

From these signals there is formed an output signal in the measurement circuit as follows:

$$E\{s\} = E\{s^+ - s^-\} \sim 2H_a.$$

Figure 9:
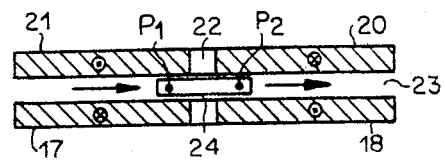
FIG. 9 is an elevational cross-section of another version of the measurement transducer along line 9—9 of FIG. 10.
Figure 10:
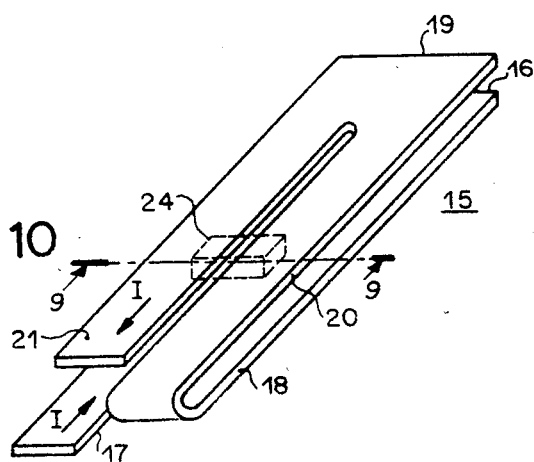
FIG. 10 is a perspective view of the measurement transducer of FIG. 9.

The aforedescribed implementation examples require two magnetic field sensors separated from one another on different substrates. The implementation example according to FIGS. 7 and 8 will be seen to be formed by a U-shaped flat strip 12 having two parallel legs 13 and 14 disposed in a common plane to avoid the aforedescribed disadvantage. The magnetic field sensor 5 is disposed on the leg 13, and the magnetic field sensor 6 on the leg 14. Both magnetic field sensors 5 and 6 are disposed in a common plane on the same flat side of the flat strip 12, in the example illustrated, on its upper flat side. But they may also be disposed on a common, non-illustrated substrate. A single flat coil 7 suffices to generate the auxiliary field $H_h$, which is disposed, for example between the flat strip 12 and the magnetic field sensors 5 and 6, and can be implemented as a double coil spiraled in rectangular form, or as a single coil, and be disposed on the same substrate as the magnetic field sensors 5 and 6. In this arrangement also the magnetic field sensor 5 is exposed to a magnetic field $H_1 = H_h + H_a + H_e$ and the magnetic field sensor 6 is exposed to a magnetic field $H_2 = H_h - H_a + H_e$. In FIGS. 9 and 10 there is shown a measurement transducer in the form of a flat strip 15, which consists of a U-shaped portion 16 with two parallel legs 17 and 18 disposed in a first common plane, and a U-shaped part 19 having legs 20 and 21 disposed in a second common plane parallel to the first plane; an end portion of the leg 18 is connected to an end portion of the leg 20. Between the legs 17 and 18, on one hand, and 20 and 21 on the other hand, there is formed a gap 22, and between the legs 17 and 21 on one hand, and 18 and 20 on the other hand, there is formed a gap 23, the gap 22 extending in FIG. 9 in a vertical direction, and the gap 23 in a horizontal direction. The flat strip 15 forms a bifilar winding, and can be stamped from a single piece, for example from a C-shaped piece, by the C-shaped piece being bent over by about 180° about its axis of symmetry, so that the legs 18 and 20 appear U-shaped in cross-section as viewed, for example, from the right in FIG. 10.

a sensor unit 24 is disposed within the gap 23, which contains the two magnetic field sensors 5 and 6 (FIG. 7), and if necessary the flat coil 7; the magnetic field sensor 5 is disposed at the point $P_1$ between the legs 17 and 21, and the magnetic field sensor 6 is disposed at the point $P_2$ between the legs 18 and 20.

Figure 11:
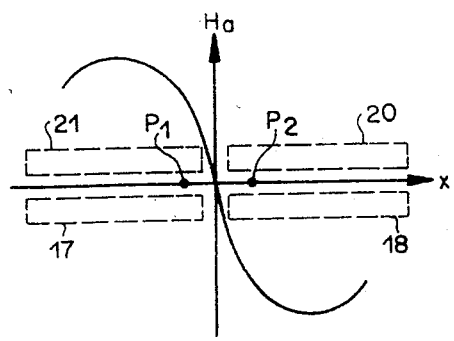
FIG. 11 is a schematic diagram showing the value of an external field within a gap.

In FIG. 11 the magnetic field $H_a$ is illustrated as a function of the location x within the gap 23. It will be seen that the curve $H_a = f(x)$ within the gap 22 may be very steep and changes from $+H_a$ to $-H_a$. This permits locating the point $P_1$ and $P_2$ near to the gap 22, and thus permits close spacing of the magnetic field sensors 5 and 6.

Figure 8:
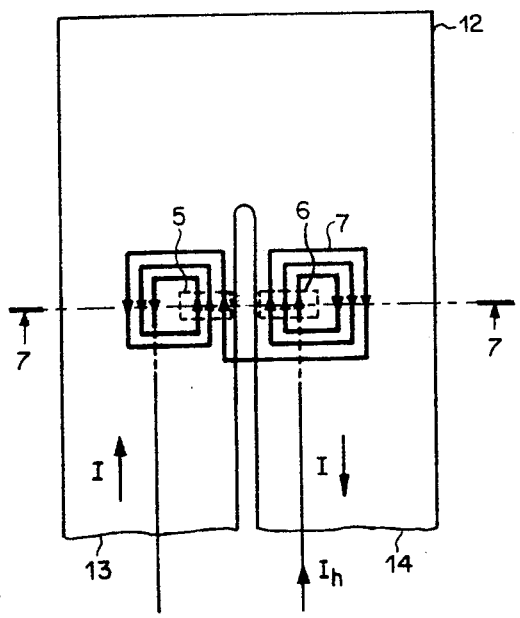
FIG. 8 is a plan view of the measurement transducer of FIG. 7.

The measurement transducer according to FIGS. 9 and 10 has the advantage with respect to the measurement transducer of FIGS. 7 and 8, that the external magnetic field $H_a$ is twice as strong at an equal current I to be measured, that the inductance of the flat conductive strip is smaller in view of its bifilar construction, and that the magnetic fields generated by the measurement transducer radiate less strongly outwardly.

Magnetoresistive thin films from anisotropic ferromagnetic material are suitable for employment as magnetic field sensors 2 or 3, or 5 and 6, respectively. These magnetic field sensors may be disposed along the easy or hard magnetic axes, depending whether they are to have a linear characteristic or a non-linear characteristic. They may be implemented together with the flat coil 7 or 8 as an integrated circuit. In order to obtain a strictly linear characteristic several magnetoresistive thin films can be joined to form an electric Wheatstone bridge. The measurement transducer, according to FIG. 2, can be implemented as a so-called compensated transducer by the external magnetic field $H_a$ being compensated by an amplifier and an auxiliary coil. Hall generators or surface wave oscillators may, for example, be suitable as magnetic field sensors. Such measures are illustrated in greater detail in Swiss Patent Applications Nos. 10520/79-0 (corresponding U.S. patent application Ser. No. 188,339 filed on Sept. 18, 1980 10521/79-1, 7234/80-0, 7235/80-1, 9567/80-3 (corresponding U.S. application Ser. No. 331,981 filed Dec. 18, 1981), and 9568/80-5 (corresponding U.S. application Ser. No. 332,215, filed Dec. 18, 1981), and are not therefore illustrated here in greater detail.

I wish it to be understood that I do not desire to be limited to the exact details of construction shown and described, for obvious modifications will occur to a person skilled in the art.

Having thus described the invention, what I claim as new and desire to be secured by Letters Patent is as follows:

1. A current measuring device for measuring a current flowing in a two-legged U-shaped strip without the use of a magnetic core, said current generating a first primary magnetic field near the first leg of said U-shaped conductor and a second primary magnetic field near the second leg of said U-shaped conductor, said first and second primary magnetic fields being oppositely oriented, said current measuring device comprising:
 (a) a first magnetic field sensor located proximate said first leg of said U-shaped conductor for detecting said first primary magnetic field and any stray magnetic field present near said conductor and for producing a first output signal in response thereto;
 (b) a second magnetic field sensor located proximate said second leg of said U-shaped conductor for detecting said second primary magnetic field and any stray magnetic field present near said conductor, and for producing a second output signal in response thereto, and
 (c) circuit means for receiving said first output signal and said second output signal and for producing a third output signal proportional to said current to be measured and substantially independent of said stray magnetic field.

2. The device of claim 1, wherein said first and second magnetic field sensors are linear and said circuit means subtracts said first and second output signals to produce a third output signal proportional to said current to be measured, said third output signal being substantially independent of said stray magnetic field.

3. The device of claim 1 wherein said conductor comprises first and second connected U-shaped strips, said first U-shaped strip having first and second legs, said second U-shaped strip having first and second legs, said first magnetic sensor being positioned between the first leg of the first U-shaped strip and the first leg of said second U-shaped strip, said second magnetic sensor being positioned between the second leg of said first U-shaped body and the second leg of said second U-shaped body.

4. The device of claim 1 wherein said magnetic field sensors are non-linear and wherein said current measuring device further includes:

coil means for generating an alternating auxiliary magnetic field, said auxiliary magnetic field alternatingly increasing to a maximum and decreasing to a minimum, wherein said first magnetic sensor detects a first combined magnetic field comprising said first primary magnetic field, said stray field, and said auxiliary field, and wherein said second magnetic sensor detects a second combined magnetic field comprising said second primary magnetic field, said stray field and said auxiliary field, said first magnetic field sensor being adapted to produce an output pulse for each zero crossing of said first combined magnetic field, and said second magnetic field sensor being adapted to produce an output pulse for each zero crossing of said second combined magnetic field, there being successively one pulse from said first sensor and one pulse from said second sensor while said alternating auxiliary field is increasing, the interval therebetween being proportional to said current to be measured and independent of said stray field, and there being successively one pulse from said second sensor and one pulse from said first sensor while said alternating field is decreasing, the interval therebetween being proportional to said current to be measured and independent of said stray field.

5. The device of claim 4 wherein said time intervals proportional to said current are measured by a circuit comprising a means for generating reference pulses at a predetermined frequency and gating means for passing said reference pulses only during said time intervals to be measured.

6. A current measuring device for measuring the current flowing in a strip-shaped conductor without the use of a magnetic core, said current generating a first primary magnetic field near a first surface portion of said strip and a second primary magnetic field near a second surface portion of said strip, said first and second primary magnetic fields having opposite orientations, said current measuring device comprising coil means for producing an auxiliary magnetic field, said auxiliary magnetic field alternatingly increasing to a maximum and decreasing to a minimum, a first non-linear magnetic sensor mounted proximate said first surface portion of said conductor for detecting a first combined magnetic field, said first combined magnetic field comprising said first primary magnetic field, said auxiliary field and any stray magnetic field present near said conductor, said first sensor producing an output pulse for each zero crossing of said first combined magnetic field, and a second non-linear magnetic sensor mounted near the second surface portion of said conductor for detecting a second combined magnetic field, said second combined magnetic field comprising said second primary magnetic field, said auxiliary magnetic field and said stray magnetic field, said second sensor producing an output pulse for each zero crossing of said second combined magnetic field, there being successively one pulse from said first sensor and one pulse from said second sensor while said auxiliary magnetic field is increasing, the interval therebetween being proportional to said current to be measured and substantially independent of said stray magnetic field, there being successively one pulse from said second sensor and one pulse from said first sensor while said auxiliary magnetic field is decreasing, the interval therebetween being proportional to said current to be measured and substantially independent of said stray magnetic field, the duraction of said intervals being measured by a circuit comprising a gate which is adapted to pass reference pulses of predetermined frequency only during said intervals.

* * * * *